United States Patent
Xu et al.

(10) Patent No.: US 11,967,282 B2
(45) Date of Patent: Apr. 23, 2024

(54) DISPLAY PANEL AND DISPLAY DEVICE

(71) Applicant: HKC CORPORATION LIMITED, Shenzhen (CN)

(72) Inventors: Liao Xu, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/355,643

(22) Filed: Jul. 20, 2023

(65) Prior Publication Data

US 2024/0087524 A1    Mar. 14, 2024

(30) Foreign Application Priority Data

Nov. 9, 2022   (CN) .......................... 202211398502.5

(51) Int. Cl.
    *G09G 3/3233*     (2016.01)
    *H10K 59/121*     (2023.01)

(52) U.S. Cl.
    CPC ....... *G09G 3/3233* (2013.01); *H10K 59/1213* (2023.02); *G09G 2300/0426* (2013.01); *G09G 2300/0452* (2013.01); *G09G 2300/0819* (2013.01); *G09G 2300/0842* (2013.01); *G09G 2300/0861* (2013.01);
(Continued)

(58) Field of Classification Search
    CPC ......... G09G 3/3233; G09G 2300/0426; G09G 2300/0452; G09G 2300/0819; G09G 2300/0842; G09G 2300/0861; G09G 2310/0262; G09G 2310/08; G09G 2320/043; H10K 59/1213
See application file for complete search history.

(56) References Cited

U.S. PATENT DOCUMENTS

| | | |
|---|---|---|
| 2018/0182289 A1 | 6/2018 | Jung et al. |
| 2019/0066583 A1* | 2/2019 | Chang ................. G09G 3/3233 |
| 2021/0335987 A1 | 10/2021 | Kim et al. |

FOREIGN PATENT DOCUMENTS

| | | |
|---|---|---|
| CN | 103531149 A | 1/2014 |
| CN | 104361862 A | 2/2015 |

(Continued)

OTHER PUBLICATIONS

Office Action dated Dec. 15, 2022, in corresponding Chinese Application No. 202211398502.5, 18 pages.

(Continued)

*Primary Examiner* — Stacy Khoo
(74) *Attorney, Agent, or Firm* — Maier & Maier, PLLC

(57) ABSTRACT

A display panel and a display device, related to the field of display technology. The display panel includes a first sub-pixel, a first pixel circuit, a second sub-pixel and a second pixel circuit. The first sub-pixel and the second sub-pixel have the same luminous color. When the display panel is configured to display a same frame of image, the first sub-pixel is driven by the first pixel circuit to emit light, or the second sub-pixel is driven by the second pixel circuit to emit light. In this case, when multiple frames of images are continuously displayed by the display panel, the first sub-pixel and the second sub-pixel can emit light alternately, such that the service life of the display panel can be prolonged, and the performance and competitiveness of the product can be improved.

17 Claims, 9 Drawing Sheets

(52) U.S. Cl.
CPC . *G09G 2310/0262* (2013.01); *G09G 2310/08* (2013.01); *G09G 2320/043* (2013.01)

(56) References Cited

FOREIGN PATENT DOCUMENTS

| | | | |
|---|---|---|---|
| CN | 106531767 | A | 3/2017 |
| CN | 107507568 | A | 12/2017 |
| CN | 109166529 | A | 1/2019 |
| CN | 109215582 | A | 1/2019 |
| CN | 110189706 | A | 8/2019 |
| CN | 110599963 | A | 12/2019 |
| CN | 111244128 | A | 6/2020 |
| CN | 114038425 | A | 2/2022 |
| CN | 114708833 | A | 7/2022 |
| CN | 115064566 | A | 9/2022 |
| CN | 115440162 | A | 12/2022 |
| WO | 2015062318 | A1 | 5/2015 |

OTHER PUBLICATIONS

Office Action dated Dec. 28, 2022, in corresponding Chinese Application No. 202211398502.5, 8 pages.
Notification to Grant dated Jan. 12, 2023, in corresponding Chinese Application No. 202211398502.5, 3 pages.

\* cited by examiner

DISPLAY PANEL AND DISPLAY DEVICE

CROSS-REFERENCE TO RELATED APPLICATION

Pursuant to 35 U.S.C. § 119 and the Paris Convention, this application claims the benefit of Chinese Patent Application No. 202211398502.5 filed on Nov. 9, 2022, the content of which is incorporated herein by reference.

TECHNICAL FIELD

The present application relates to the field of display technology, and in particular, to a display panel and a display device.

BACKGROUND

With the continuous development of display technologies, organic light emitting diode (OLED) display panels are increasingly applied in high-performance displays. OLED display panels have excellent characteristics such as being free from backlight source, wide color gamut, high contrast, wide viewing angle, and strong flexibility, and have broad development prospects.

In related arts, an OLED display panel usually includes a plurality of sub-pixels and a plurality of pixel circuits for driving the sub-pixels to emit light. When a frame of image is displayed by an OLED display panel, the plurality of sub-pixels are driven by the plurality of pixel circuits to emit light, so as to display the image. However, due to the serious aging problem of the OLED material during long-term operation, the service life of the OLED display panel is relatively short.

SUMMARY

The present application provides a display panel and a display device, which can solve the problem of short service life of OLED display panels in the related arts. Embodiments of the present application are as follows:

In accordance with a first aspect, a display panel is provided, which includes a first sub-pixel and a first pixel circuit. The first pixel circuit is connected to the first sub-pixel to drive the first sub-pixel to emit light. The display panel also includes a second sub-pixel and a second pixel circuit. A luminous color of the second sub-pixel is the same as that of the first sub-pixel, and the second pixel circuit is connected to the second sub-pixel to drive the second sub-pixel to emit light. When the display panel is configured to display a same frame of image, the first sub-pixel is driven by the first pixel circuit to emit light, or the second sub-pixel is driven by the second pixel circuit to emit light.

In the present application, the display panel includes a first sub-pixel, a first pixel circuit, a second sub-pixel and a second pixel circuit. The first sub-pixel and the second sub-pixel have the same luminous color. When the display panel is configured to display the same frame of image, the first pixel circuit drives the first sub-pixel to emit light, or the second pixel circuit drives the second sub-pixel to emit light. In the case that multiple frames of images are continuously displayed by the display panel, the first sub-pixel and the second sub-pixel can emit light alternately. In this way, when the display panel includes a plurality of first sub-pixels and a plurality of second sub-pixels, the service life of the display panel can be prolonged, and the performance and competitiveness of products can be improved.

In some embodiments, when the display panel is configured to display a N-th frame of image, the first sub-pixel is driven by the first pixel circuit to emit light, and the second pixel circuit is not in operation, so that the second sub-pixel does not emit light; when the display panel is configured to display a (N+1)-th frame image, the second sub-pixel is driven by the second pixel circuit to emit light, and the first pixel circuit is not in operation, so that the first sub-pixel does not emit light; and N is an odd number.

In some embodiments, the second sub-pixels and the first sub-pixels are arranged along a thickness direction of the display panel.

In some embodiments, the first pixel circuit includes a drive transistor, a capacitor, and a plurality of switch transistors, and the plurality of switch transistors in the first pixel circuit are all P-type transistors. The second pixel circuit includes a drive transistor, a capacitor, and a plurality of switch transistors, the switch transistors in the second pixel circuit have a same number as that of the switch transistors in the first pixel circuit, and the plurality of switch transistors in the second pixel circuit correspond one-to-one to the plurality of switch transistors in the first pixel circuit; a connection mode between the drive transistor, the capacitor and the plurality of switch transistors in the second pixel circuit is the same as that between the drive transistor, the capacitor and the plurality of switch transistors in the first pixel circuit, and the plurality of switch transistors in the second pixel circuit are all N-type transistors.

In some embodiments, a switch transistor in the second pixel circuit shares a control electrode with a corresponding switch transistor in the first pixel circuit.

In some embodiments, the display panel includes a substrate, and a first metal layer, a second metal layer and a third metal layer on the substrate, the second metal layer is arranged between the first metal layer and the third metal layer, the second metal layer is insulated from the first metal layer, and the second metal layer is insulated from the third metal layer. First electrodes and second electrodes of the switch transistors and the drive transistor in the second pixel circuit are all located at the first metal layer. Control electrodes are all located at the second metal layer; in the first pixel circuit. First electrodes and second electrodes of the switch transistors and the drive transistor in the first pixel circuit are all located at the third metal layer.

In some embodiments, an orthographic projection of the first electrode of any switch transistor in the second pixel circuit on the substrate overlaps that of the first electrode of a corresponding switch transistor in first pixel circuit on the substrate. An orthographic projection of the second electrode of any switch transistor in the second pixel circuit on the substrate overlaps that of the second electrode of a corresponding switch transistor in the first pixel circuit on the substrate.

In some embodiments, the plurality of switch transistors in the first pixel circuit includes a first transistor, a second transistor, a third transistor, a fourth transistor, a fifth transistor and a sixth transistor. A first electrode of the first transistor is configured to input a first voltage signal, a first electrode of the second transistor is configured to input a data signal, a second electrode of the first transistor, a second electrode of the second transistor and a first electrode of the drive transistor are connected in common to a first node. A second electrode of the drive transistor, a first electrode of the third transistor and a first electrode of the fourth transistor are connected in common to a second node. A first electrode plate of the capacitor is connected to the first electrode of the first transistor, a second electrode plate of the capacitor, a second electrode of the third transistor, a control electrode of the drive transistor and a second electrode of the fifth transistor are connected in common to a third node. A first electrode of the fifth transistor is configured to input a second voltage signal. A second electrode of the fourth transistor, a second electrode of the sixth transistor and an anode of the first sub-pixel are connected in common to a fourth node. A first electrode of the sixth transistor is configured to input the second voltage signal. A cathode of the first sub-pixel is configured to input a third voltage signal. When the first sub-pixel is driven by the first pixel circuit to emit light, the fifth transistor and the sixth transistor are switched on in a first period; the second transistor and the third transistor are switched on in a second period; and the first transistor and the fourth transistor are switched on in a third period.

In accordance with a second aspect, a display device is provided, which includes a gate driver, a source driver, and the display panel according to any one of the first aspect. The first pixel circuit is connected to the gate driver and the source driver to drive the first sub-pixel to emit light; and the second pixel circuit is connected to the gate driver and the source driver, to drive the second sub-pixel to emit light.

In some embodiments, the first pixel circuit includes a drive transistor, a capacitor, and a plurality of switch transistors, and the plurality of switch transistors in the first pixel circuit are all P-type transistors. The second pixel circuit includes a drive transistor, a capacitor, and a plurality of switch transistors, and the plurality of switch transistors in the second pixel circuit are all N-type transistors. A connection mode between the second pixel circuit and the gate driver is the same as that between the first pixel circuit and the gate driver; and a connection between the second pixel circuit and the source driver is the same as that between the first pixel circuit and the source driver.

It should be understood that, for the beneficial effects of the second aspect, reference may be made to the relevant description in the first aspect, which will not be repeated here.

BRIEF DESCRIPTION OF DRAWINGS

In order to illustrate schemes in the embodiments of the present application more clearly, the following will briefly introduce the drawings that need to be used for describing the embodiments. Obviously, the drawings in the following description are merely some embodiments of the present application, and for those of ordinarily skills in the art, other drawings can also be obtained according to these drawings without any creative effort.

DETAILED DESCRIPTION

In order to make the objectives, schemes and beneficial effects of the present application more comprehensible, implementations of the present application will be further described in detail below with reference to the drawings.

It should be understood that the phrase "a/the plurality of" mentioned in the present application refers to two or more. In the description of the present application, unless otherwise noted, the symbol "/" means "or", for example, A/B means A or B. The expression "and/or" in here is only an association relationship that describes the associated objects, which means that three kinds of relationships may be included, for example, an expression of A and/or B may mean that A is existed alone, A and B are both existed, and B is existed alone. In addition, to facilitate the description of the schemes in the present application, words such as "first" and "second" are used to distinguish the same items or similar items having basically the same function and effect. It should be understood for those skilled artisans that the words "first", "second" and the like do not limit the quantity and execution order, and the words "first", "second" and the like are not necessarily different.

The display panel provided by an embodiment of the present application will be explained in detail below. In each embodiment of the present application, any connection between electronic devices refers to an electrical connection. The electrical connection here refers to the connection through wires so that electrical signals can be transmitted between two electronic devices.

Figure 1:
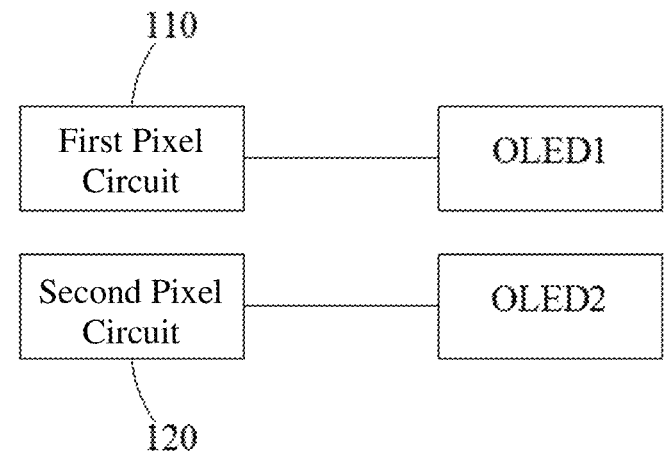
FIG. 1 is a schematic structural diagram of a display panel in accordance with an embodiment of the present application.

FIG. 1 is a schematic structural diagram of a display panel 10 in accordance with an embodiment of the present application. As shown in FIG. 1, the display panel 10 includes a first sub-pixel OLED1, a first pixel circuit 110, a second sub-pixel OLED2 and a second pixel circuit 120. The first sub-pixel OLED1 and the second sub-pixel OLED2 may be current-type self-luminous devices. For example, the first sub-pixel OLED1 and the second sub-pixel OLED2 may be OLED light-emitting devices made of organic electroluminescence (EL) materials, or may be micro light emitting diode (MicroLED) devices or mini light emitting diode (MiniLED) devices. In some specific embodiments, both the first sub-pixel OLED1 and the second sub-pixel OLED2 are OLED light-emitting devices.

The first pixel circuit 110 is connected to the first sub-pixel OLED1. The first pixel circuit 110, when in operation, is configured to output a driving current to the first sub-pixel OLED1, so as to drive the first sub-pixel OLED1 to emit light. Generally, the sub-pixels in the display panel 10 can be classified into red (R) sub-pixels, green (G) sub-pixels and blue (B) sub-pixels according to the luminous color of the sub-pixels. Here, the first sub-pixel OLED1 may be any one of an R sub-pixel, a G sub-pixel, and a B sub-pixel. The second pixel circuit 120 is connected to the second sub-pixel OLED2. The second pixel circuit 120, when in operation, is configured to output a driving current to the second sub-pixel OLED2, so as to drive the second sub-pixel OLED2 to emit light. Here, the luminous color of the second sub-pixel OLED2 is the same as the luminous color of the first sub-pixel OLED1. That is to say, in case that the first sub-pixel OLED1 is an R sub-pixel, the second sub-pixel OLED2 is also an R sub-pixel; in case that the first sub-pixel OLED1 is a G sub-pixel, the second sub-pixel OLED2 is also a G sub-pixel; and in case that OLED1 is a B sub-pixel, the second sub-pixel OLED2 is also a B sub-pixel.

In an embodiment of the present application, when the display panel 10 is configured to display the same frame of image, the first sub-pixel OLED1 is driven by the first pixel circuit 110 to emit light, or the second sub-pixel OLED2 is driven by the second pixel circuit 120 to emit light. That is to say, from the perspective of visual effects, the luminous effect of the second sub-pixel OLED2 is the same as that of the first sub-pixel OLED1 when emitting light. The luminous effect here refers to the influence of the sub-pixel on the entire frame of image when the sub-pixel emits light, which requires that the first sub-pixel OLED1 and the second sub-pixel OLED2 have the same color and located adjacent to each other, and the light emitted from the second sub-pixel OLED2 and the first sub-pixel OLED1 can have the same luminance (that is, gray scale). In other words, in the embodiment of the present application, when the display panel 10 is in operation, in case that the luminance of other sub-pixels except the first sub-pixel OLED1 and the second sub-pixel OLED2 remains unchanged, if the display panel 10 starts from a state of "the first sub-pixel OLED1 emits light and the second sub-pixel OLED2 does not emit light" is switched to a state of "the first sub-pixel OLED1 does not emit light and the second sub-pixel OLED2 emits light", the image displayed on the display panel 10 remains unchanged. Therefore, when the display panel 10 continuously displays multiple frames of images, the first sub-pixel OLED1 and the second sub-pixel OLED2 can emit light alternately. In this way, when the display panel has a plurality of first sub-pixels OLED1 and a plurality of second sub-pixels OLED2, the service life of the display panel 10 can be prolonged, and the performance and competitiveness of the product can be improved.

The following will illustrate solutions of the display panel 10 "when displaying the same frame of image, the first sub-pixel OLED1 is driven by the first pixel circuit 110 to emit light, or the second sub-pixel OLED2 is driven by the second pixel circuit 120 to emit light", in detail from three possible embodiments.

In the display panel 10 provided in an embodiment of the present application, if the display panel 10 needs M (M is a positive integer, for example, M is equal to 1080×1920×3) sub-pixels to display a frame of image, then the display panel provided in the embodiment of the present application 10 may include 2M sub-pixels. The 2M sub-pixels are equally divided into a first part and a second part. The M sub-pixels in the first part are in one-to-one correspondence with the M sub-pixels in the second part, and the corresponding two sub-pixels, when emit light, have the same luminous effect. That is to say, any sub-pixel in the first part can be the first sub-pixel OLED1. Among the M sub-pixels in the second part, the sub-pixel corresponding to the first sub-pixel OLED1 is the second sub-pixel OLED2. In this way, when the display panel 10 is in operation, the corresponding two sub-pixels in the first part and the second part can work alternately, thereby prolonging the service life of the display panel 10.

In a first possible embodiment, to enable the corresponding two sub-pixels in the first part and the second part to emit light with exactly the same luminous effect, the 2M sub-pixels may be divided into upper and lower layers along the thickness direction of the display panel 10, and the corresponding two sub-pixels in the first part and the second part are arranged along the thickness direction of the display panel 10.

Figure 2:
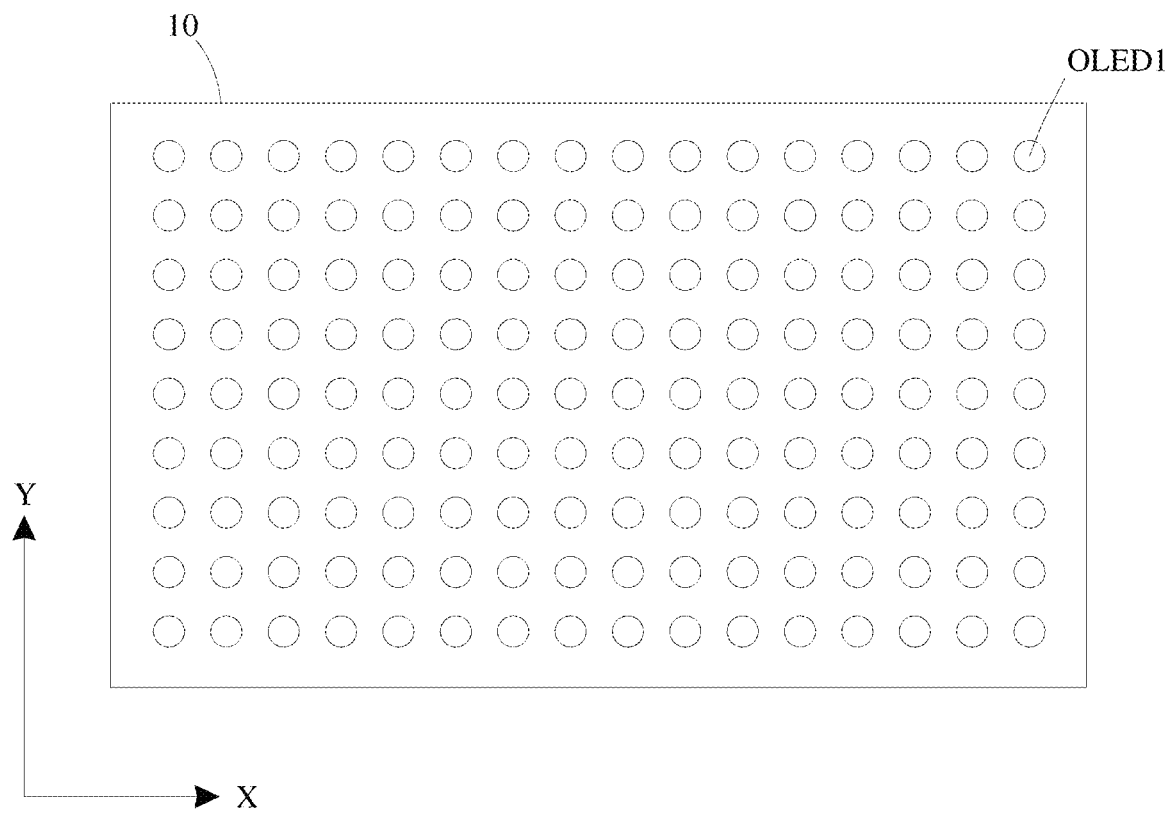
FIG. 2 is a schematic diagram of an arrangement of sub-pixels in a first part in accordance with an embodiment of the present application.
Figure 3:
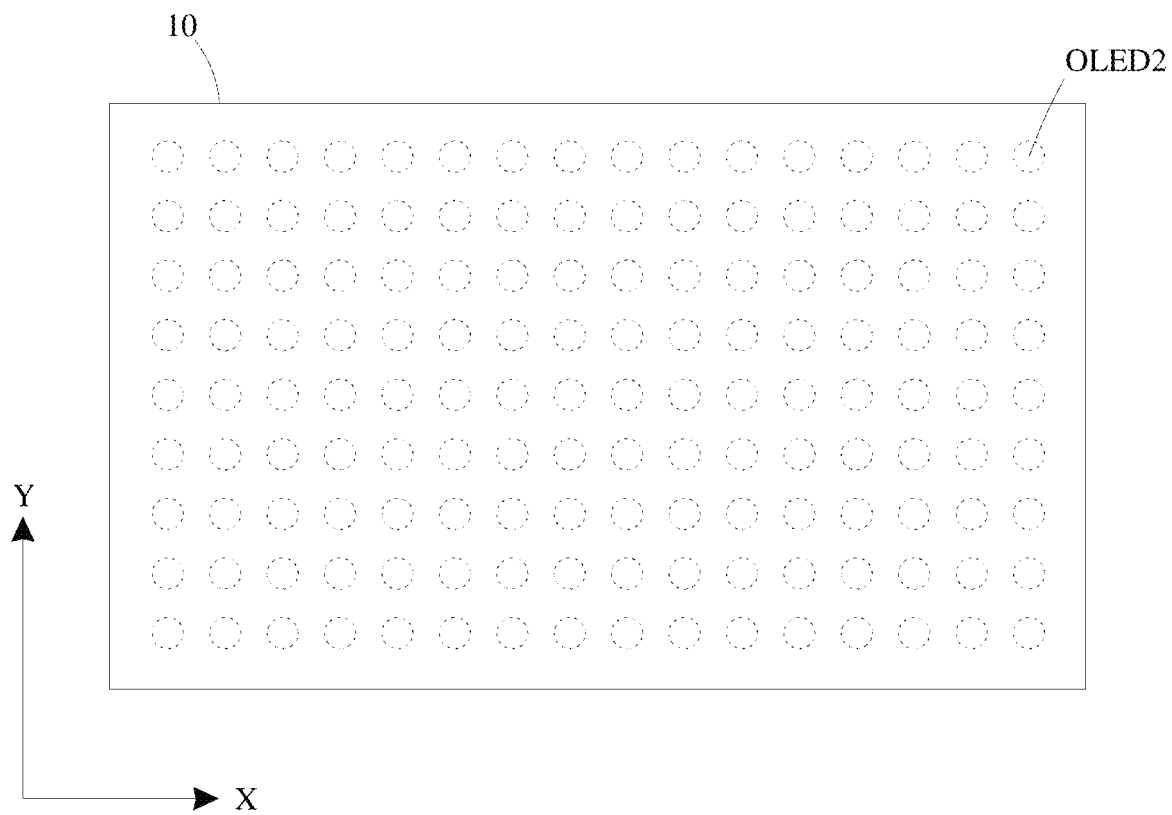
FIG. 3 is a schematic diagram of an arrangement of sub-pixels in a second part in accordance with an embodiment of the present application.
Figure 4:
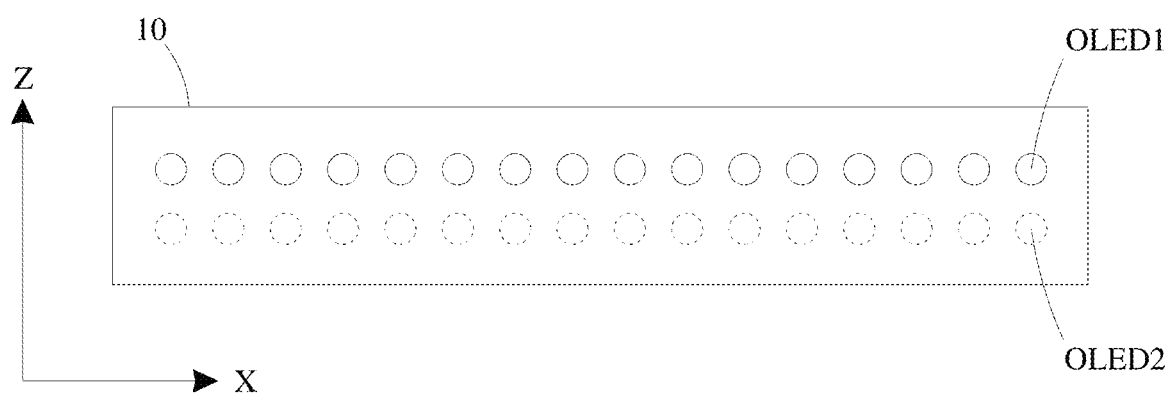
FIG. 4 is a schematic cross-sectional view along a thickness direction of a first display panel in accordance with an embodiment of the present application.

Specifically, FIG. 2 is a schematic diagram of an arrangement of sub-pixels in the first part in accordance with an embodiment of the present application; FIG. 3 is a schematic diagram of an arrangement of sub-pixels in the second part in accordance with an embodiment of the present application; and FIG. 4 is a schematic cross-sectional view along the thickness direction of the display panel 10 in accordance with an embodiment of the present application. As shown in FIGS. 2 to 4, for ease of view, the sub-pixels in the first part are represented by solid lines, and the sub-pixels in the second part are represented by dotted lines. For ease of description, a first direction X, a second direction Y, and a third direction Z are defined in the embodiment of the present application. The first direction X, the second direction Y and the third direction Z are perpendicular to each other. In here, the first direction X and the second direction Y are extending directions of the display panel 10. That is to say, when the display panel 10 displays a frame of image, the frame of image extends along the first direction X and the second direction Y. The third direction Z is the thickness direction of the display panel 10. As shown in FIG. 2 and FIG. 4, the sub-pixels in the first part may be distributed along the first direction X and the second direction Y, and the sub-pixels in the first part are all located on the same plane perpendicular to the third direction Z. As shown in FIG. 3 and FIG. 4, the sub-pixels in the second part are also distributed along the first direction X and the second direction Y, and the sub-pixels in the second part are all located on the same plane perpendicular to the third direction Z. As shown in FIG. 4, along the third direction Z, the sub-pixels in the first part and the sub-pixels in the second part are located on different planes.

In this embodiment, two corresponding sub-pixels in the first part and the second part are arranged along the thickness direction of the display panel 10. Taking the first sub-pixel OLED1 in the first part and the second sub-pixel OLED2 in the second part as an example, the first sub-pixel OLED1 is corresponded to the second sub-pixel OLED2. The second sub-pixel OLED2 and the first sub-pixel OLED1 are arranged along the third direction Z. That is to say, the direction from the second sub-pixel OLED2 to the first sub-pixel OLED1 is perpendicular to the extending direction of the display panel 10.

In a second possible embodiment, to enable the corresponding two sub-pixels in the first part and the second part emit light with exactly the same luminous effect, the 2M sub-pixels can be divided into upper and lower layers along the thickness direction of the display panel 10, and the arrangement directions of the corresponding two sub-pixels in the first part and the second part intersect with the third direction Z.

Figure 5:
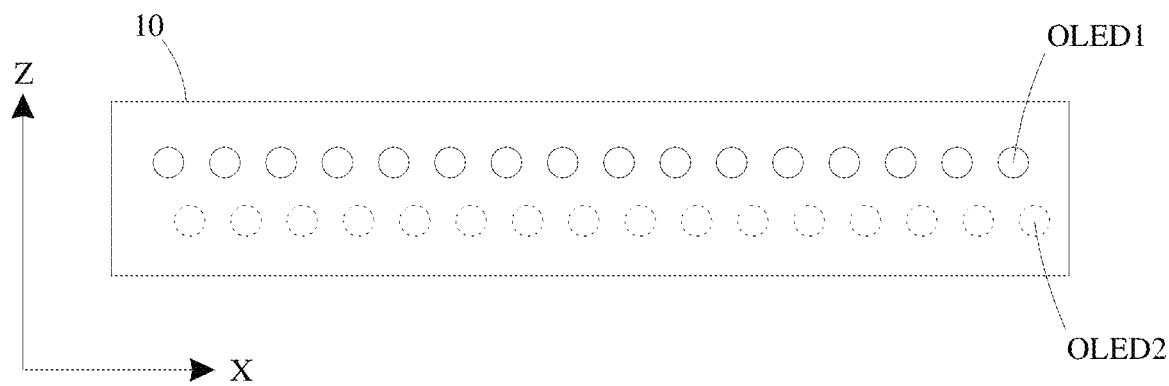
FIG. 5 is a schematic cross-sectional view along a thickness direction of a second display panel in accordance with an embodiment of the present application.

Specifically, FIG. 5 is a schematic cross-sectional view along the thickness direction of another display panel 10 in accordance with an embodiment of the present application. For ease of view, the sub-pixels in the first part are represented by solid lines, and the sub-pixels in the second part are represented by dotted lines. As shown in FIG. 5, in this embodiment, the sub-pixels in the first part are distributed along the first direction X and the second direction Y, and the sub-pixels in the first part are all located on the same plane perpendicular to the third direction Z. The sub-pixels in the second part are distributed along the first direction X and the second direction Y, and the sub-pixels in the second part are all located on the same plane perpendicular to the third direction Z. Along the third direction Z, the sub-pixels in the first part and the sub-pixels in the second part are located on different planes. In this embodiment, taking the first sub-pixel OLED1 in the first part and the second sub-pixel OLED2 in the second part as an example, the first sub-pixel OLED1 is corresponded to the second sub-pixel OLED2. As shown in FIG. 5, the first sub-pixel OLED1 and the second sub-pixel OLED2 are arranged obliquely. In this case, the direction from the second sub-pixel OLED2 to the first sub-pixel OLED1 intersects with the third direction Z but is not perpendicular to the third direction Z.

In this possible embodiment, the sub-pixels in the first part of the upper layer along the third direction Z may block the sub-pixels in the second part of the lower layer, and the sub-pixels in the first part of the upper layer along the third direction Z may not block the sub-pixels of the second portion of the underlying layer. Generally, the sub-pixels in the display panel 10 (such as the sub-pixels in the first part) may be made transparent, so that the normal light emission of the sub-pixels in the second part will not be affected.

In a third possible embodiment, the sub-pixels in the first part and the sub-pixels in the second part are located on the same plane, the sub-pixels in the first part and the sub-pixels in the second part are distributed alternately, and the corresponding two sub-pixels in the first part and the second part are distributed in adjacent.

Figure 6:
FIG. 6 is a schematic diagram of an arrangement of sub-pixels in accordance with an embodiment of the present application.
Figure 7:
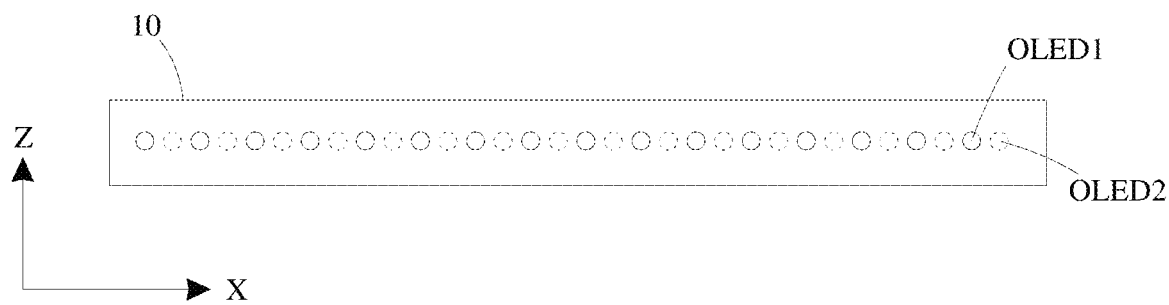
FIG. 7 is a schematic cross-sectional view along a thickness direction of a third display panel in accordance with an embodiment of the present application.

Specifically, FIG. 6 is a schematic diagram of an arrangement of sub-pixels in accordance with an embodiment of the present application, and FIG. 7 is a schematic cross-sectional view along the thickness direction of another display panel 10 in accordance with an embodiment of the present application. In the embodiment shown in FIGS. 6 and 7, the shown sub-pixels include the sub-pixels in the first part and the sub-pixels in the second part. For ease of view, the sub-pixels in the first part are represented by solid lines, and the sub-pixels in the second part are represented by dotted lines. As shown in FIG. 6 and FIG. 7, the sub-pixels in the first part may be distributed along the first direction X and the second direction Y. The sub-pixels in the second part are also distributed along the first direction X and the second direction Y, and along the third direction Z, the sub-pixels in the first part and the second part are located on the same plane.

In this embodiment, a sub-pixel of the second part is sandwiched between any two adjacent sub-pixels of the first part, and one of the two adjacent sub-pixels of the first part and the sandwiched sub-pixel of the second part are the corresponding two sub-pixels. Similarly, a sub-pixel of the first part is sandwiched between any two adjacent sub-pixels of the second part, and one of the two adjacent sub-pixels of the second part and the sandwiched sub-pixel of the first part are the corresponding two sub-pixels. In this way, an objective that the position of the corresponding two sub-pixels are adjacent to each other can be achieved. Taking the first sub-pixel OLED1 in the first part and the second sub-pixel OLED2 in the second part as an example, the first sub-pixel OLED1 is corresponded to the second sub-pixel OLED2. The first sub-pixel OLED1 and the second sub-pixel OLED2 are arranged along the first direction X, and no other sub-pixel is existed between the first sub-pixel OLED1 and the second sub-pixel OLED2. In some other embodiments (not shown), the first sub-pixel OLED1 and the second sub-pixel OLED2 may also be arranged along the second direction Y, which will not be repeated here.

When the display panel 10 provided by an embodiment of the present application is in operation, the sub-pixels in the first part (including the first sub-pixel OLED1) and the sub-pixels in the second part (including the second sub-pixel OLED2) may emit light alternately. Alternate light emission here refers to that: when the display panel 10 is configured to display some frame of images, the sub-pixels in the first part emit light; when the display panel 10 is configured to display other frame of images, the sub-pixels in the second part emit light.

For example, when the display panel 10 is configured to display the N-th frame of image, the first part of the sub-pixels emits light; when the display panel 10 is configured to display the (N+1)-th frame of image, the second part of the sub-pixels emits light. N is an odd number. Taking the first sub-pixel OLED1 and the second sub-pixel OLED2 as an example, that is, when the display panel 10 is configured to display the N-th frame of image, the first sub-pixel OLED1 is driven by the first pixel circuit 110 to emit light, and the second pixel circuit 120 is not in operation, so that the second sub-pixel OLED2 does not emit light. When the display panel 10 is configured to display the (N+1)-th frame of image, the second sub-pixel OLED2 is driven by the second pixel circuit 120 to emit light, and the first pixel circuit 110 is not in operation so that the first sub-pixel OLED1 does not emit light.

For another example, when the display panel 10 is configured to display images from the 1-st frame to the I-th frame, the sub-pixels in the first part emit light; when the display panel 10 is configured to display images from the (I+1)-th frame to the (2I)-th frame, the sub-pixels of the second part emit light; and when the display panel 10 is configured to display images from the (2I+1)-th frame to the (3I)-th frame, the sub-pixels of the first part emit light; and when the display panel 10 is configured to display images from the (3I+1)-th frame to the (4I)-th frame, the sub-pixels of the second part emits light, etc., I is an integer greater than 1, and no further details will be provided here.

It would be understood that, in the above two examples, when the display panel 10 is in operation, the number of light-emitting frames of the sub-pixels in the first part is the same as the number of light-emitting frames of the sub-pixels in the second part. In some other embodiments, the number of light-emitting frames of the sub-pixels in the first part may also be different from the number of light-emitting frames of the sub-pixels in the second part. For example, when the display panel 10 is configured to display images from the 1-st frame to the 5-th frame, the sub-pixels in the first part emit light; when the display panel 10 is configured to display images from the 6-h frame to the 8-th frame, the sub-pixels in the second part emit light; when the panel 10 is configured to display images from the 9-th frame to the 13-th frame, the sub-pixels in the first part emit light; when the display panel 10 is configured to display images from the 14-th frame to the 16-th frame, the sub-pixels in the second part emit light, etc., no further details will be provided here. In addition, in the above two examples, when the display panel 10 is in operation to display a frame of image, light may be emitted from M sub-pixels in the first part or may be emitted from M sub-pixels in the second part. In some other embodiments, when a frame of image is displayed by the display panel 10, light may be emitted from P (P is a positive integer, and P is less than M) sub-pixels from the M sub-pixels in the first part and M-P sub-pixels from the M sub-pixels in the second part. It should be noted that, in this embodiment, when the display panel 10 is configured to display a frame of image, any two sub-pixels that emit light do not correspond to each other. That is to say, when a frame of image is displayed by the display panel 10, light is only emitted from one of the two corresponding sub-pixels in the first part and the second part, that is, either the sub-pixel in the first part emits light or the sub-pixel in the second part emits light. The circuit structure in the display panel 10 (including a circuit structure of the first pixel circuit 110 and a circuit structure of the second pixel circuit 120) will be explained in detail below by taking the first sub-pixel OLED1 and the second sub-pixel OLED2 as an example.

Figure 8:
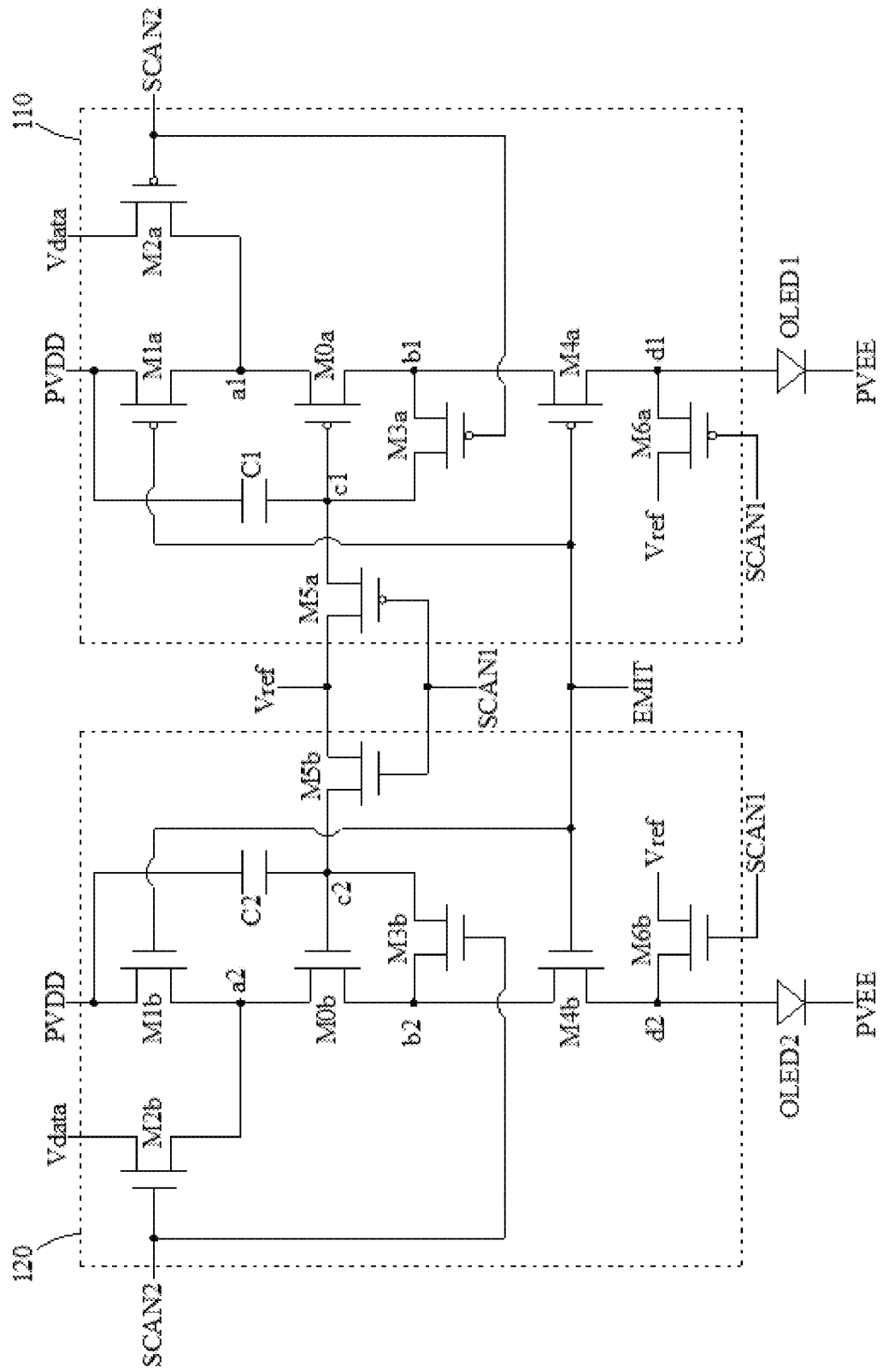
FIG. 8 is a circuit structure diagram of the display panel in accordance with an embodiment of the present application.

FIG. 8 is a circuit structure diagram of a display panel 10 in accordance with an embodiment of the present application. As shown in FIG. 8, the first pixel circuit 110 includes a drive transistor M0a, a capacitor C1 and a plurality of switch transistors. The second pixel circuit 120 includes a drive transistor M0b, a capacitor C2 and a plurality of switch transistors. The transistors here (including the switch transistor and the drive transistor) may be metal oxide semiconductor field effect transistors (MOSFETs). The plurality of switch transistors in the first pixel circuit 110 are all P-type transistors, and the plurality of switch transistors in the second pixel circuit 120 are all N-type transistors. The drive transistor M0a in the first pixel circuit 110 may also be a P-type transistor in case that the plurality of switch transistors in the first pixel circuit 110 are all P-type transistors. The drive transistor M0b in the second pixel circuit 120 may also be an N-type transistor in case that the plurality of switch transistors in the second pixel circuit 120 are all N-type transistors.

In the embodiment of the present application, the circuit structures of the first pixel circuit 110 and the second pixel circuit 120 (the circuit structure includes the number of transistors and capacitors and the connection modes contained in the pixel circuit) are completely the same. That is to say, the number of switch transistors in the second pixel circuit 120 is the same as the number of switch transistors in the first pixel circuit 110, and the plurality of switch transistors in the second pixel circuit 120 and the plurality of switch transistors in the first pixel circuit 110 are in a one-to-one correspondence. The corresponding two switch transistors are connected in the same manner with other electronic devices (including drive transistors, switch transistors and capacitors) in the respective pixel circuits.

The circuit structures of the first pixel circuit 110 and the second pixel circuit 120 will be explained in detail below with reference to FIG. 8. In the following description, the corresponding two electronic devices or circuit nodes in the first pixel circuit 110 and the second pixel circuit 120 are numbered (such as first, second, third, etc.) in the same way, and the two corresponding electronic devices are distinguished from each other with different reference symbols. For example, the first pixel circuit 110 includes a first transistor M1a; and the second pixel circuit 120 includes a first transistor M1b corresponding to the first transistor M1a (in the first pixel circuit 110). Similarly, the first pixel circuit 110 includes a drive transistor M0a, and correspondingly the second pixel circuit 120 includes a drive transistor M0b. The first pixel circuit 110 includes a first node a1, and correspondingly the second pixel circuit 120 includes a first node a2.

Specifically, as shown in FIG. 8, the first pixel circuit 110 includes a drive transistor M0a, a capacitor C1 and a plurality of switch transistors. The plurality of switch transistors may specifically include a first transistor M1a, a second transistor M2a, a third transistor M3a, a fourth transistor M4a, a fifth transistor M5a and a sixth transistor M6a. Each transistor (including the switch transistor and the drive transistor M0a) includes a first electrode and a second electrode. The first electrode of the transistor refers to an input of the transistor (that is, the source of the P-type transistor and the drain of the N-type transistor), and the second electrode of the transistor refers to an output of the transistor (that is, the drain of the P-type transistor and the source of the N-type transistor).

The first electrode of the first transistor M1a is configured to input a first voltage signal PVDD, and the first electrode of the second transistor M2a is configured to input a data signal Vdata. The second electrode of the first transistor M1a, the second electrode of the second transistor M2a and the first electrode of the drive transistor M0a are connected in common to a first node a1. The second electrode of the drive transistor M0a, the first electrode of the third transistor M3a, and the first electrode of the fourth transistor M4a are connected in common to a second node b1. A first electrode plate of the capacitor C1 is connected to the first electrode of the first transistor M1a. A second electrode plate of the capacitor C1, the second electrode of the third transistor M3a, a control electrode of the drive transistor M0a, and the second electrode of the fifth transistor M5a are connected in common to a third node c1. The first electrode of the fifth transistor M5a is configured to input a second voltage signal Vref. The second electrode of the fourth transistor M4a, the second electrode of the sixth transistor M6a and an anode of the first sub-pixel OLED1 are connected in common to a fourth node d1. The first electrode of the sixth transistor M6a is configured to input the second voltage signal Vref. A cathode of the first sub-pixel OLED1 is configured to input a third voltage signal PVEE. In this embodiment, the first voltage signal PVDD may be 4.6V (volts), the data signal Vdata may be 0 to 6V (depending on a target brightness of the first sub-pixel OLED1), the second voltage signal Vref may be −3V, and the third voltage signal PVEE may be −3.9V.

The second pixel circuit 120 includes a drive transistor M0b, a capacitor C2 and a plurality of switch transistors. Specifically, the plurality of switch transistors may include a first transistor M1b, a second transistor M2b, a third transistor M3b, a fourth transistor M4b, a fifth transistor M5b and a sixth transistor M6b. The first electrode of the first transistor M1b is configured to input a first voltage signal PVDD, and the first electrode of the second transistor M2b is configured to input a data signal Vdata. The second electrode of the first transistor M1b, the second electrode of the second transistor M2b and the first electrode of the drive transistor M0b is connected in common to a first node a2. The second electrode of the drive transistor M0b, the first electrode of the third transistor M3b, and the first electrode of the fourth transistor M4b are connected in common to a second node b2. A first electrode plate of the capacitor C2 is connected to the first electrode of the first transistor M1b. A second electrode plate of the capacitor C2, the second electrode of the third transistor M3b, a control electrode of the drive transistor M0b, and the second electrode of the fifth transistor M5b are connected in common to a third node c2. The first electrode of the fifth transistor M5b is configured to input a second voltage signal Vref. The second electrode of the fourth transistor M4b, the second electrode of the sixth transistor M6b and an anode of the second sub-pixel OLED2 are connected in common to a fourth node d2. The first electrode of the sixth transistor M6b is configured to input the second voltage signal Vref. A cathode of the second sub-pixel OLED2 is configured to input a third voltage signal PVEE.

According to the above description and FIG. 8, in the embodiment of the present application, the electrical signals input by the corresponding two switch transistors in the first pixel circuit 110 and the second pixel circuit 120 are also the same. Based on this, the plurality of switch transistors in the first pixel circuit 110 are all P-type transistors, and the plurality of switch transistors in the second pixel circuit 120 are all N-type transistors, so that the first pixel circuit 110 and the second pixel circuit 120 can be avoided working simultaneously, thereby preventing the corresponding first sub-pixel OLED1 and second sub-pixel OLED2 from emitting light at the same time.

Figure 9:
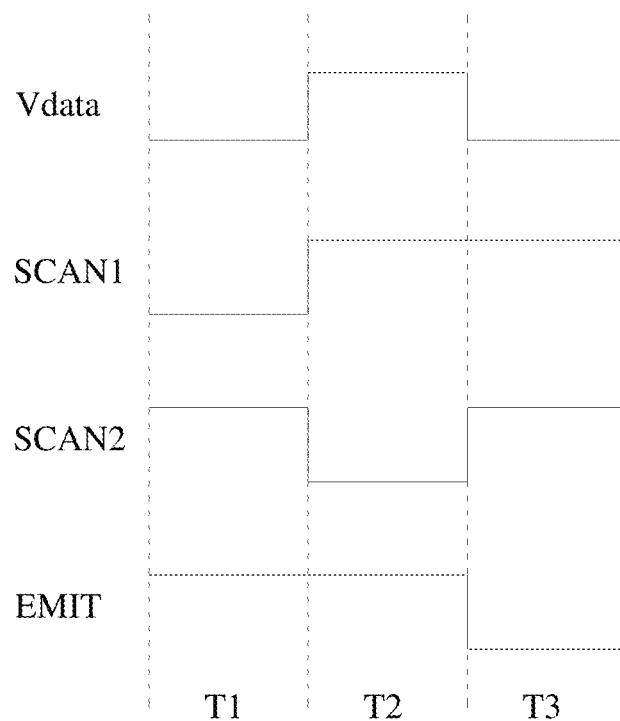
FIG. 9 is a driving sequence diagram of a first pixel circuit in accordance with an embodiment of the present application.

FIG. 9 is a driving sequence diagram of a first pixel circuit 110 in accordance with an embodiment of the present application. The control electrode of the P-type transistor is switched on when a low-level signal (−7V) is input, and is switched off when a high-level signal (8V) is input. With reference to FIG. 8 and FIG. 9, it can be seen that an operation process of the first pixel circuit 110 is as follows:

In a first period T1, a second scan signal SCAN2 and an emission signal EMIT area high-level signals. At this time, under an effect of the second scan signal SCAN2, the second transistor M2a and the third transistor M3a are switched off; and under an effect of the emission signal EMIT, the first transistor M1a and the fourth transistor M4a are switched off. A first scan signal SCAN1 is a low-level signal, and under an effect of the first scan signal SCAN1, the fifth transistor M5 a and the sixth transistor M6 a are switched on. At this time, the second voltage signal Vref is written into the third node c1 via the fifth transistor M5a to initialize the third node c1, thereby clearing a residual voltage at the third node c1. The drive transistor M0a is enabled to be in a half-on state and maintained, under an effect of the third node c1 when the second voltage signal Vref is written into the third node c1. Meanwhile, the second voltage signal Vref is written into the fourth node d1 via the sixth transistor M6a to initialize the fourth node d1, thereby clearing a residual voltage t the fourth node d1.

In a second period T2, the first scan signal SCANT and the emission signal EMIT are high-level signals. At this time, under the effect of the first scan signal SCAN1, the fifth transistor M5a and the sixth transistor M6a are switched off; under the effect of the emission signal EMIT, the first transistor M1a and the fourth transistor M4a are switched off. The second scan signal SCAN2 is a low-level signal, and under the effect of the second scan signal SCAN2, the second transistor M2a and the third transistor M3a are switched on. In addition, under the effect of the third node c1, the drive transistor M0a is in a half-on state. At this time, the data signal Vdata which is a high-level signal is written into the third node c1 via the second transistor M2a, the first node a1, the drive transistor M0a, the second node b1 and the third transistor M3a in sequence. During this process, since the second transistor M2a and the third transistor M3a are switched on under the effect of the second scan signal SCAN2, there is no voltage difference between the first electrode and the second electrode of the second transistor M2a, or between the first electrode and the second electrode of the third transistor M3a. Therefore, at the end of the second period T2, a voltage at the first node a1 is equal to a voltage of the data signal Vdata; and a voltage at the second node b1 is equal to a voltage at the third node c1, which is equal to a difference of the voltage of the data signal Vdata minus the absolute value of a threshold voltage of the drive transistor M0a. That is, $$V_{c1} = V_{Vdata} - |V_{th}|$$

Where $V_{c1}$ is the voltage at the third node c1, $V_{Vdata}$ is the voltage of the data signal Vdata, and $V_{th}$ is the threshold voltage of the drive transistor M0a.

In a third period T3, the first scan signal SCAN1 and the second scan signal SCAN2 are high level signals. At this time, under the effect of the first scan signal SCAN1, the fifth transistor M5a and the sixth transistor M6a are switched off; and under the effect of the second scan signal SCAN2, the second transistor M2a and the third transistor M3a are switched off. The emission signal EMIT is a low-level signal, and under the effect of the emission signal EMIT, the first transistor M1a and the fourth transistor M4a are switched on. In addition, under the effect of the third node c1, the drive transistor M0a is switched on. At this time, the anode of the first sub-pixel OLED1 is enabled to input the first voltage signal PVDD via the fourth transistor M4a, the drive transistor M0a and the first transistor M1a; the cathode of the first sub-pixel OLED1 is enabled to input the third voltage signal PVEE; and the first sub-pixel OLED1 is electroluminescent. During this process, the voltage at the third node c1 is equal to the difference of the voltage of the data signal Vdata minus the absolute value of the threshold voltage of the drive transistor M0a. The voltage at the first node a1 is equal to a voltage of the first voltage signal PVDD. The voltage at the second node b1 is equal to the sum of a voltage of the third voltage signal PVEE and a turn-on voltage of the first sub-pixel OLED1. That is, $$V_{c1} = V_{data} - |V_{th}|$$

$$V_{a1} = V_{PVDD}$$

$$V_{b1} = V_{PVEE} + V_{OLED1}$$

Where $V_{a1}$ is the voltage at the first node a1, $V_{PVDD}$ is the voltage of the first voltage signal PVDD, $V_{b1}$ is the voltage at the second node b1, $V_{PVEE}$ is the voltage of the third voltage signal PVEE, and $V_{OLED1}$ is a switch-on voltage of the first sub-pixel OLED1. The switch-on voltage of the first sub-pixel OLED1 is a voltage difference between the anode and the cathode of the first sub-pixel OLED1 when the first sub-pixel OLED1 is switched on.

Based on this, it can be known that a magnitude of a current of the first sub-pixel OLED1 when the first sub-pixel OLED1 emits light is:

$$I_{OLED1} = K(V_{PVDD} - |V_{th}| - (V_{data} - |V_{th}|)) = K(V_{PVDD} - V_{data})$$

Where $I_{OLED1}$ is the magnitude of the current of the first sub-pixel OLED1, and K is a coefficient, which depends on a width-to-length ratio of a channel of the drive transistor M0a.

According to the above formula, when the first sub-pixel OLED1 is driven by the first pixel circuit 110 to emit light, the threshold voltage of the drive transistor M0a can be compensated, thereby the influence of the threshold voltage of the drive transistor M0a on the luminance of the sub-pixel can be avoided while realizing the light emission of the first sub-pixel OLED1. When the pixel circuit is in operation, the voltage of the data signal Vdata can determine the luminance of the first sub-pixel OLED1. Meanwhile, the luminance of the first sub-pixel OLED1 may also be adjusted by adjusting a duty cycle of the first transistor M1a and the fourth transistor M4a through the emission signal EMIT (the duty cycle refers to a percentage of the on-time of the transistor to a total pulse duration, in a pulse cycle). Generally, when the display panel 10 is in operation, the waveforms of the emission signals EMIT of the pixel circuits corresponding to the M sub-pixels for emitting light are the same. That is to say, when the display panel 10 is in operation, in the pixel circuits corresponding to the M sub-pixels for emitting light, the duty ratio of the first transistor M1a in each pixel circuit is the same, and the duty ratio of the fourth transistor M4a in each pixel circuit is also the same. Such that the display brightness of the display panel 10 can be adjusted through the emission signals EMIT.

Figure 10:
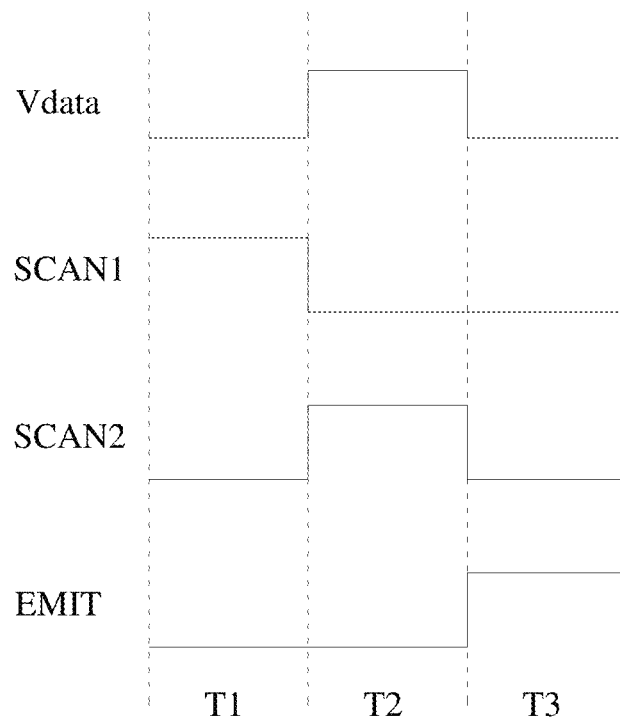
FIG. 10 is a driving sequence diagram of a second pixel circuit in accordance with an embodiment of the present application.

FIG. 10 is a driving sequence diagram of a second pixel circuit 120 in accordance with an embodiment of the present application. The control electrode of the N-type transistor is switched on when a high-level signal is input, and is switched off when a low-level signal is input. With reference to FIG. 8 and FIG. 10, it can be seen that an operation process of the second pixel circuit 120 is as follows:

In the first period T1, the second scan signal SCAN2 and the emission signal EMIT are low-level signals. At this time, under the effect of the second scan signal SCAN2, the second transistor M2b and the third transistor M3b are switched off; and under the effect of the emission signal EMIT, the first transistor M1b and the fourth transistor M4b are switched off. The first scan signal SCAN1 is a high-level signal, and under the effect of the first scan signal SCAN1, the fifth transistor M5b and the sixth transistor M6b are switched on. At this time, the second voltage signal Vref is written into the third node c2 via the fifth transistor M5b to initialize the third node c2, thereby clearing the residual voltage at the third node c2. The drive transistor M0b is enabled to be in a half-on state and maintained under the effect of the third node c2 when the second voltage signal Vref is written into the third node c2. Meanwhile, the second voltage signal Vref is written into the fourth node d2 via the sixth transistor M6b to initialize the fourth node d2, thereby clearing the residual voltage at the fourth node d2.

In the second period T2, the first scan signal SCAN1 and the emission signal EMIT are low-level signals. At this time, under the effect of the first scan signal SCAN1, the fifth transistor M5b and the sixth transistor M6b are switched off; and under the effect of the emission signal EMIT, the first transistor M1b and the fourth transistor M4b are switched off. The second scan signal SCAN2 is a high-level signal, and under the effect of the second scan signal SCAN2, the second transistor M2b and the third transistor M3b are switched on. In addition, under the effect of the third node c2, the drive transistor M0b is in a half-on state. At this time, the data signal Vdata which is a high-level signal is written into the third node c2 via the second transistor M2b, the first node a2, the drive transistor M0b, the second node b2 and the third transistor M3b in sequence. During this process, since the second transistor M2b and the third transistor M3b are switched on under the effect of the second scan signal SCAN2, there is no voltage difference between the first electrode and the second electrode of the second transistor M2b, or between the first electrode and the second electrode of the third transistor M3b. Therefore, at the end of the second period T2, the voltage at the first node a2 is equal to the voltage of the data signal Vdata; the voltage at the second node b2 is equal to the voltage at the third node c2, which is equal to the difference of the voltage of the data signal Vdata minus the absolute value of a threshold voltage of the drive transistor M0b.

In the third period T3, the first scan signal SCAN1 and the second scan signal SCAN2 are low level signals. At this time, under the effect of the first scan signal SCAN1, the fifth transistor M5b and the sixth transistor M6b are switched off; and under the effect of the second scan signal SCAN2, the second transistor M2b and the third transistor M3b are switched off. The emission signal EMIT is a high-level signal, and under the effect of the emission signal EMIT, the first transistor M1b and the fourth transistor M4b are switched on. In addition, under the effect of the third node c2, the drive transistor M0b is switched on. At this time, the anode of the second sub-pixel OLED2 is enabled to input the first voltage signal PVDD via the fourth transistor M4b, the drive transistor M0b and the first transistor M1b; the cathode of the second sub-pixel OLED2 is enabled to input the third voltage signal PVEE, and the second sub-pixel OLED2 is electroluminescence. During this process, the voltage at the third node c2 is equal to the difference of the voltage of the data signal Vdata minus the absolute value of the threshold voltage of the drive transistor M0b. The voltage at the first node a2 is equal to the voltage of the first voltage signal PVDD. The voltage at the second node b2 is equal to the sum of the voltage of the third voltage signal PVEE and the turn-on voltage of the second sub-pixel OLED2.

The second pixel circuit 120, when in operation, may also compensate the threshold voltage of the drive transistor M0b, so as to avoid the threshold voltage of the drive transistor M0b from affecting the luminance of the sub-pixel while realizing the light emission of the second sub-pixel OLED2. In addition, the display brightness of the display panel 10 can also be adjusted through the emission signal EMIT, no further details will be provided here.

It can be seen that when the second pixel circuit 120 is in operation, except that the level of the scan signal (including the first scan signal SCAN1, the second scan signal SCAN2, and the emission signal EMIT) that needs to be input is reversed compared to the level that needs to be input when the first pixel circuit 110 is in operation, the other operation processes are exactly the same with the first pixel circuit 110. Therefore, the corresponding two switch transistors in the first pixel circuit 110 and the second pixel circuit 120 can input the same electrical signal, such as, the control electrode of the first transistor M1a in the first pixel circuit 110 and the control electrode of the second transistor M1b of the second pixel circuit 120 are both configured to input the emission signal EMIT; the control electrode of the second transistor M2a in the first pixel circuit 110 and the control electrode of the second transistor M2b in the second pixel circuit 120 are both configured to input the second scan signal SCAN2. In this case, since the plurality of switch transistors in the first pixel circuit 110 are all P-type transistors, and the plurality of switch transistors in the second pixel circuit 120 are all N-type transistors, the situation that one of the first pixel circuit 110 and the second pixel circuit 120 is in operation, while the other one is not can be achieved through a control of a level of each scan signal (including the first scan signal SCAN1, the second scan signal SCAN2, and the emission signal EMIT).

Figure 11:
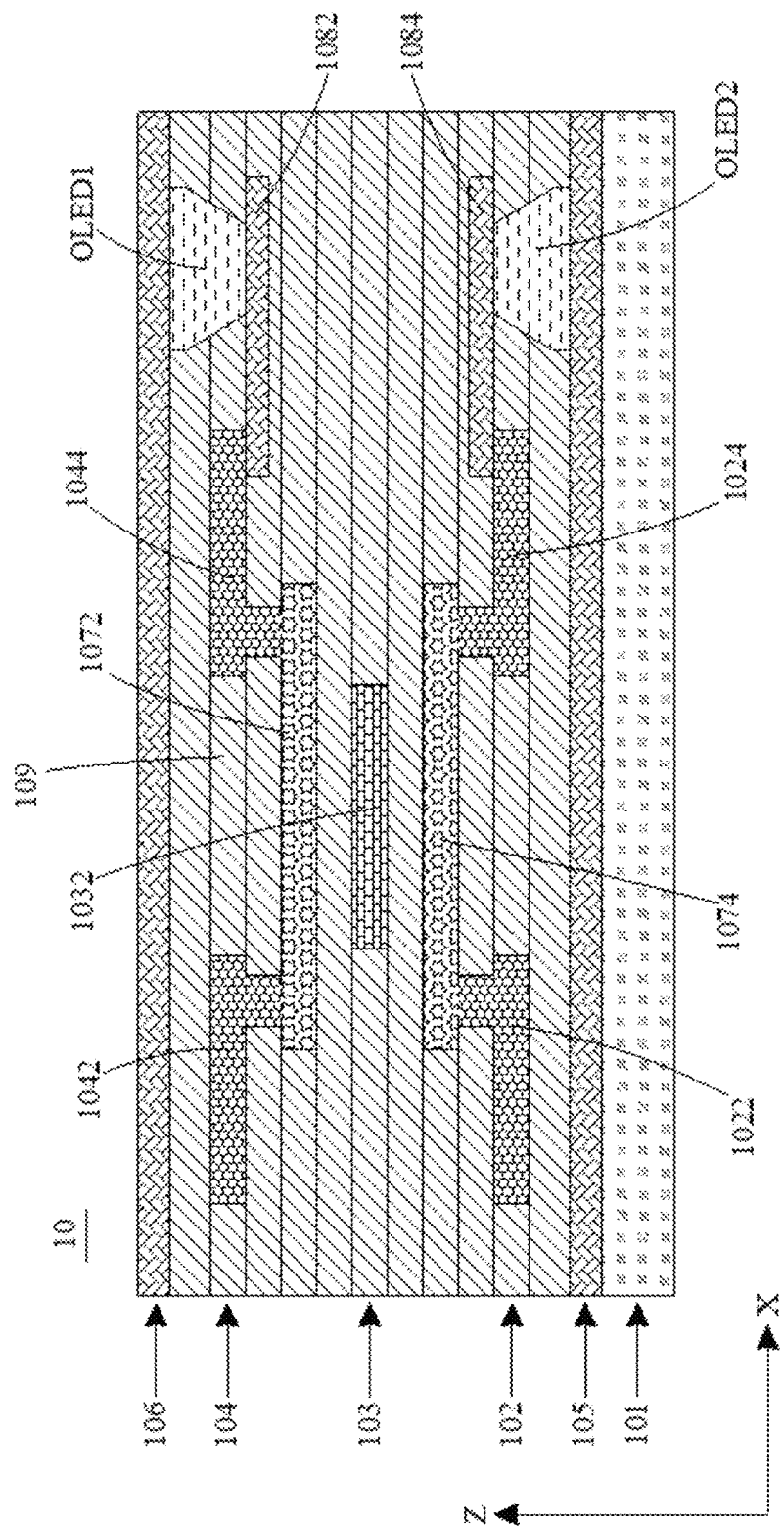
FIG. 11 is a schematic cross-sectional diagram of a structure of the first display panel in accordance with an embodiment of the present application.

FIG. 11 is a schematic cross-sectional diagram of a structure of a display panel 10 in accordance with an embodiment of the present application. As shown in FIG. 11, in some embodiments, based on the circuit structure shown in FIG. 8, in order to save the occupied area of the pixel circuit, each switch transistor in the second pixel circuit 120 shares a control electrode 1032 with the corresponding switch transistor in the first pixel circuit 110.

Specifically, the switch transistor in the first pixel circuit 110, when being a P-type transistor, may have a bottom-gate structure, that is, the control electrode of the transistor is located below the first electrode and the second electrode (here, the third direction Z is the upward direction). The switch transistor in the second pixel circuit 120, when being a N-type transistor, may have a top-gate structure, that is, the control electrode of the transistor is located above the first electrode and the second electrode. In this case, each switch transistor in the second pixel circuit 120 and the corresponding switch transistor in the first pixel circuit 110 can share one control electrode. In this way, the manufacturing process of the display panel 10 can be simplified. As shown in FIG. 11, the display panel 10 may include a substrate 101, a fourth metal layer 105, a first metal layer 102, a second metal layer 103, a third metal layer 104 and a fifth metal layer 106, which are sequentially stacked along the third direction Z. In this embodiment, an insulation layer 109 is provided between any two metal layers (including the fourth metal layer 105, the first metal layer 102, the second metal layer 103, the third metal layer 104 and the fifth metal layer 106) to achieve the purpose of insulation.

The substrate 101 may be a glass plate, or may be a PI film made of polyimide (PI) material. The substrate 101 is configured to carry other devices in the display panel 10. Both the fourth metal layer 105 and the fifth metal layer 106 are cathode layers. When the display panel 10 is in operation, the fourth metal layer 105 is configured o provide the third voltage signal PVEE to the cathode of the second sub-pixel OLED2; the fifth metal layer 106 is configured to provide the third voltage signal PVEE to the cathode of the first sub-pixel OLED1. That is to say, when the display panel 10 is in operation, the voltages of the fourth metal layer 105 and the fifth metal layer 106 are equal. The first metal layer 102 is configured to form the first electrode 1022 and the second electrode 1024 of each switch transistor and of the drive transistor in the second pixel circuit 120. In other words, the first electrode 1022 and the second electrode 1024 of each switch transistor and of the drive transistor in the second pixel circuit 120 are all located at the first metal layer 102. The second metal layer 103 is configured to form the control electrode 1032. Here, the control electrode 1032 includes the control electrode of each switch transistor and of the drive transistor in the second pixel circuit 120 and the control electrode of each switch transistor and of the drive transistor in the first pixel circuit 110. The third metal layer 104 is configured to form the first electrode 1042 and the second electrode 1044 of each switch transistor and of the drive transistor in the first pixel circuit 110. In other words, the first electrode 1042 and the second electrode 1044 of each switch transistor and of the drive transistor in the first pixel circuit 110 are located at the third metal layer 104.

In the embodiment shown in FIG. 11, only one switch transistor in the first pixel circuit 110 and one corresponding switch transistor in the second pixel circuit 120 are shown. It can be seen from FIG. 11 that the corresponding two switch transistors in the first pixel circuit 110 and the second pixel circuit 120 share the control electrode 1032. In addition, in the embodiment shown in FIG. 11, the orthographic projection of the first electrode 1022 of the switch transistor in the second pixel circuit 120 on the substrate 101 overlaps the orthographic projection of the first electrode 1042 of the corresponding switch transistor in the first pixel circuit 110 on the substrate 101. The orthographic projection of the second electrode 1024 of the switch transistor in the second pixel circuit 120 on the substrate 101 overlaps the orthographic projection of the corresponding second electrode 1044 of the switch transistor in the first pixel circuit 110 on the substrate 101. The orthographic projection here refers to the projection along (the opposite direction of) the third direction Z. That is to say, along the third direction Z, the first electrodes of the corresponding two switch transistors in the first pixel circuit 110 and the second pixel circuit 120 overlap; and the second electrodes of the corresponding two switch transistors in the first pixel circuit 110 and the second pixel circuit 120 also overlap. In this way, the area occupied by the first pixel circuit 110 and the second pixel circuit 120 on the substrate 101 can be minimized.

In the embodiment shown in FIG. 11, a first active layer 1072 is also provided between the second metal layer 103 and the third metal layer 104. The first active layer 1072 is an active layer in each switch transistor and drive transistor in the first pixel circuit 110. The first active layer 1072 may be a P-type semiconductor layer. The first active layer 1072 may be connected to the first electrode 1042 and the second electrode 1044 of the switch transistor in the first pixel circuit 110. Also, a second active layer 1074 is provided between the first metal layer 102 and the second metal layer 103. The second active layer 1074 is an active layer in each switch transistor and drive transistor in the second pixel circuit 120. The second active layer 1074 may be an N-type semiconductor layer. The second active layer 1074 may be connected to the first electrode 1022 and the second electrode 1024 of the switch transistor in the second pixel circuit 120. No further details will be provided here.

In the embodiment shown in FIG. 11, a first sub-pixel OLED1 and a second sub-pixel OLED2 are also shown. The first sub-pixel OLED1 may be connected to the switch transistor in the first pixel circuit 110 via the first anode 1082. The second sub-pixel OLED2 may be connected to the switch transistor in the second pixel circuit 120 via the second anode 1084. In this embodiment, a top-emission manner may be adopted when the first sub-pixel OLED1 emits light. That is, the light emitted by the first sub-pixel OLED1 is shot out along the third direction Z (towards the side away from the substrate 101). When the second sub-pixel OLED2 emits light, a bottom-emission manner may be adopted. That is, the light emitted by the second sub-pixel OLED2 is shot out along the direction opposite to the third direction Z (towards the side where the fourth metal layer 105 is located), and then the light shot out from the second sub-pixel OLED2 is reflected back by the fourth metal layer 105 and eventually shot out from the fifth metal layer 106. It should be understood for those skilled in the art that each film layer in the display panel 10 (such as the first metal layer 102, the second metal layer 103, the first active layer 1072, the second active layer 1074 and the insulation layer 109) may all be transparent. Therefore, each film layer will not block the light emission of the first sub-pixel OLED1 and the second sub-pixel OLED2. In this embodiment, the arrangement direction of the second sub-pixel OLED2 and the first sub-pixel OLED1 may be along the third direction Z. At this time, schematic diagrams of the arrangement of the sub-pixels in the display panel 10 may be as shown in FIGS. 2 to 4.

Figure 12:
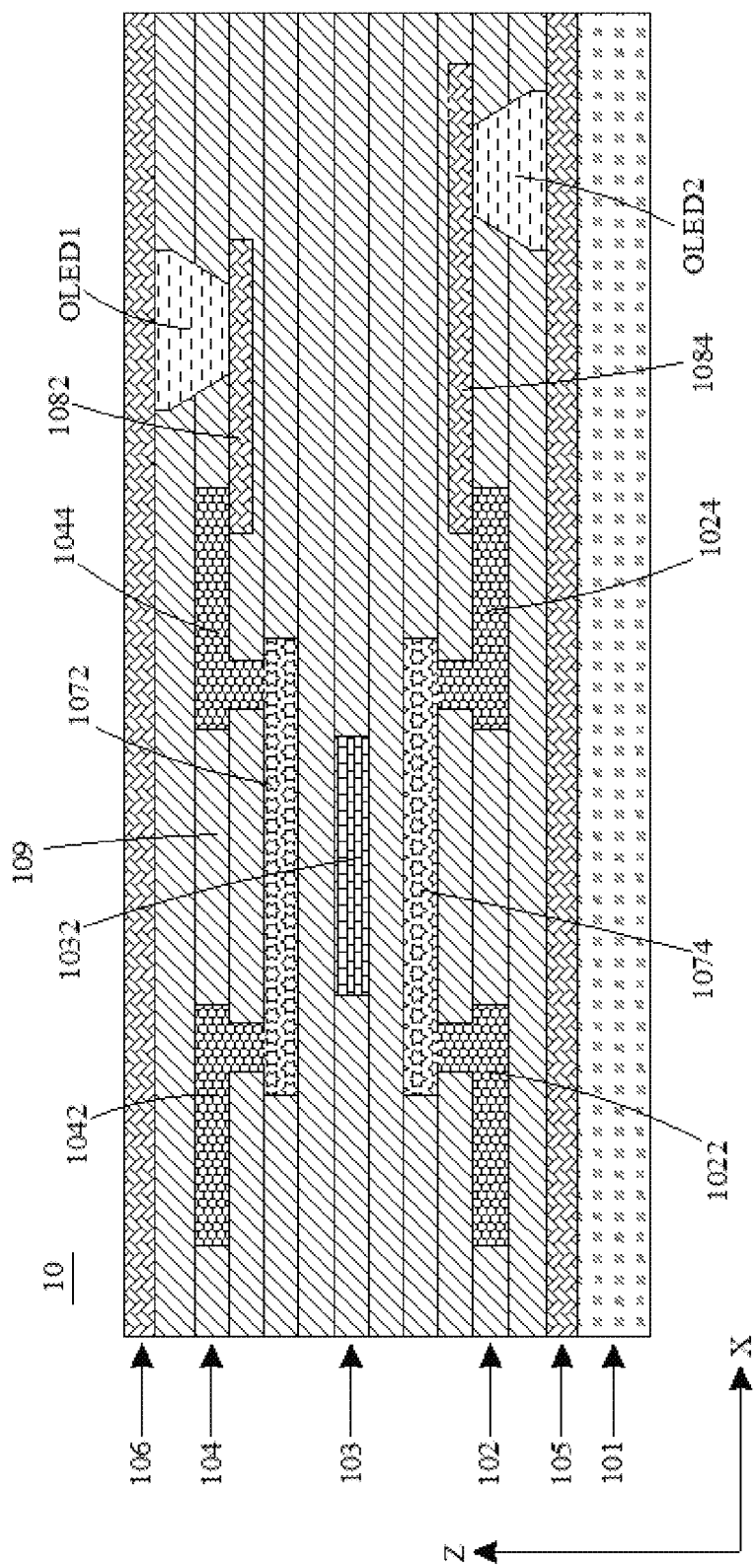
FIG. 12 is a schematic cross-sectional diagram of a structure of the second display panel in accordance with an embodiment of the present application.
Figure 13:
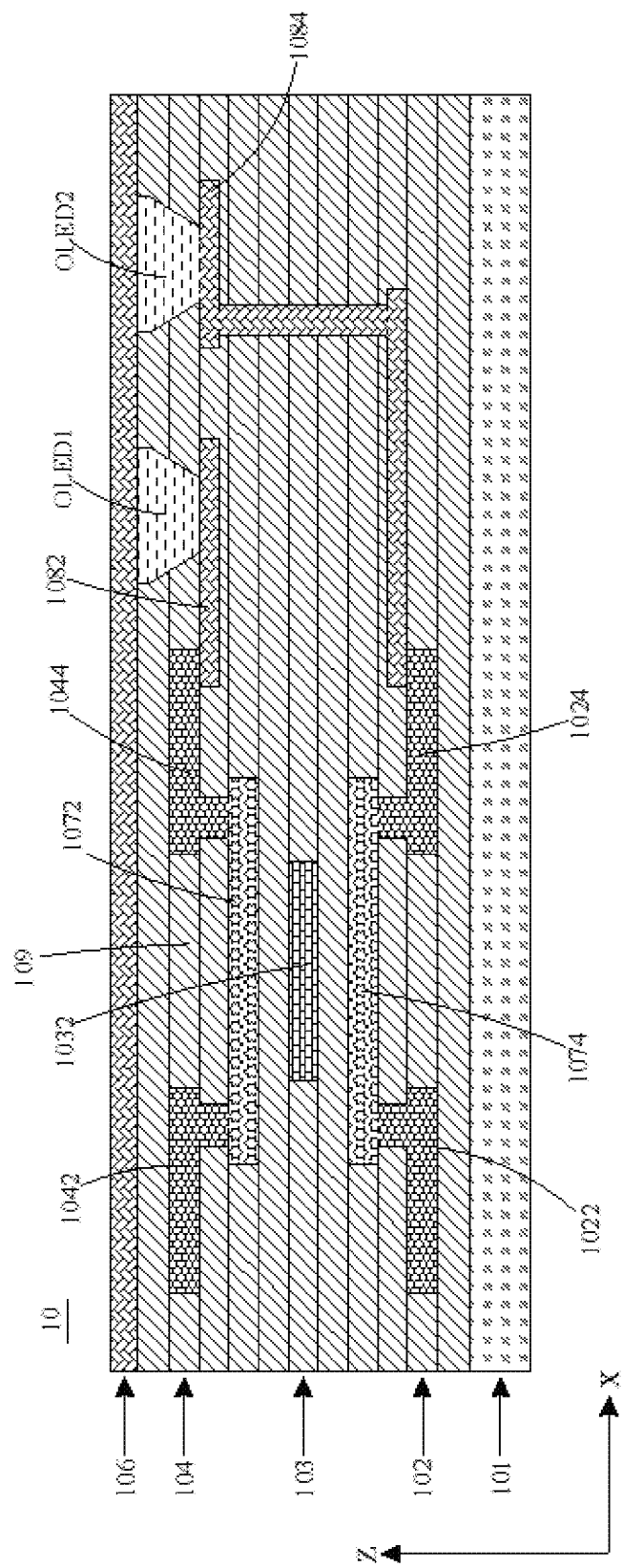
FIG. 13 is a schematic cross-sectional diagram of a structure of the third display panel in accordance with an embodiment of the present application.

FIG. 12 is a schematic cross-sectional diagram of a structure of another display panel 10 in accordance with an embodiment of the present application. As shown in FIG. 12, in some embodiments, the arrangement direction of the second sub-pixel OLED2 and the first sub-pixel OLED1 may also intersect with the third direction Z. In this case, a schematic diagram of the arrangement of the sub-pixels in this display panel 10 may be as shown in FIG. 5. FIG. 13 is a schematic cross-sectional diagram of a structure of yet another display panel 10 in accordance with an embodiment of the present application. As shown in FIG. 13, in some embodiments, the second sub-pixel OLED2 and the first sub-pixel OLED1 may be located on the same plane and distributed adjacently. In this case, the schematic diagram of the arrangement of the sub-pixels in this display panel 10 may be shown in FIGS. 6 to 7. In this embodiment, since the second sub-pixel OLED2 and the first sub-pixel OLED1 can share the cathode layer, the display panel 10 may not have the fourth metal layer 105.

Figure 14:
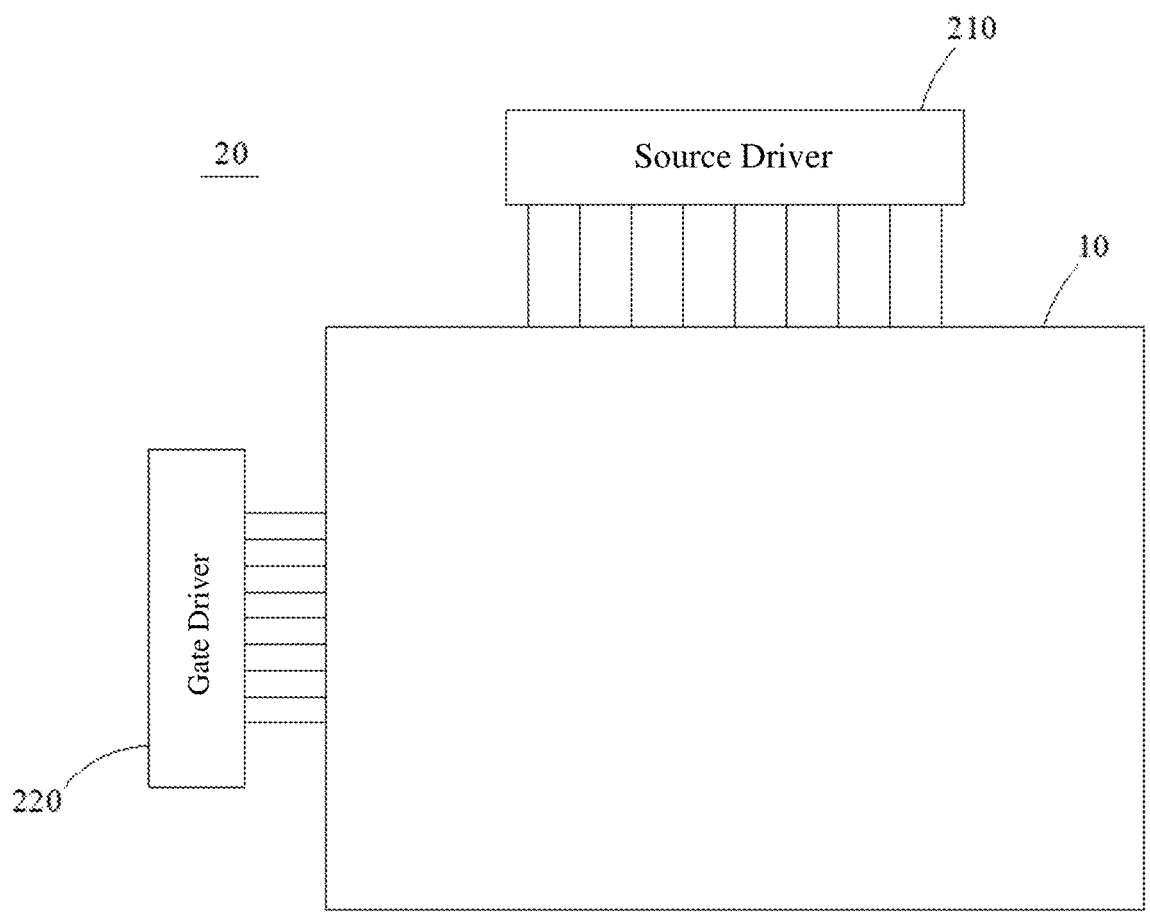
FIG. 14 is a schematic structural diagram of a display device in accordance with an embodiment of the present application.

FIG. 14 is a schematic structural diagram of a display device 20 in accordance with an embodiment of the present application. As shown in FIG. 14, it is also provided a display device 20 in accordance with the embodiment of the present application, which includes a gate driver 220, a source driver 210 and a display panel 10. The display panel 10 here is the display panel 10 in any one of the above-mentioned embodiments.

Specifically, the display panel 10 includes a first sub-pixel OLED1, a first pixel circuit 110, a second sub-pixel OLED2 and a second pixel circuit 120. The luminous color of the second sub-pixel OLED2 is the same as the luminous color of the first sub-pixel OLED1. When the display panel 10 is configured to display the same frame of image, the first pixel circuit 110 drives the first sub-pixel OLED1 to emit light, or the second pixel circuit 120 drives the second sub-pixel OLED2 to emit light. In this embodiment, the first pixel circuit 110 is also connected to the gate driver 220 and the source driver 210, so that when the display device 20 is in operation, an electrical signal may be output by the gate driver 220 and the source driver 210 to the first pixel circuit 110 in case that the first sub-pixel OLED1 needs to emit light, thereby enabling the first pixel circuit 110 to drive the first sub-pixel OLED1 to emit light. The second pixel circuit 120 is also connected to the gate driver 220 and the source driver 210, so that when the display device 20 is in operation, an electrical signal may be output by the gate driver 220 and the source driver 210 to the second pixel circuit 120 in case that the second sub-pixel OLED2 needs to emit light, thereby enabling the second pixel circuit 120 to drive the second sub-pixel OLED2 to emit light.

In some embodiments, when the display panel 10 is configured to display the N-th frame of image, the first pixel circuit 110 works to drive the first sub-pixel OLED1 to emit light, and the second pixel circuit 120 is not in operation so that the second sub-pixel OLED2 does not emit light. When the display panel 10 is configured to display the (N+1)-th frame image, the second pixel circuit 120 works to drive the second sub-pixel OLED2 to emit light, and the first pixel circuit 110 is not in operation so that the first sub-pixel OLED1 does not emit light, and N is an odd number.

In some embodiments, the second sub-pixel OLED2 and the first sub-pixel OLED1 are arranged along the thickness direction of the display panel 10.

In some embodiments, the first pixel circuit 110 includes a drive transistor M0$a$, a capacitor C1 and a plurality of switch transistors, and the plurality of switch transistors in the first pixel circuit 110 are all P-type transistors. The second pixel circuit 120 includes a drive transistor M0$b$, a capacitor C2 and a plurality of switch transistors. The number of switch transistors in the second pixel circuit 120 is the same as the number of switch transistors in the first pixel circuit 110, and the plurality of switch transistors in the second pixel circuit 120 and the plurality of switch transistors in the first pixel circuit 110 are in a one-to-one correspondence. The connection mode between the drive transistor M0$b$, the capacitor C and the switch transistors in the second pixel circuit 120 is the same as the connection mode between the drive transistor M0$a$, the capacitor C and the switch transistors in the first pixel circuit 110. The switch transistors in the second pixel circuit 120 are all N-type transistors.

In some embodiments, a switch transistor in the second pixel circuit 120 shares a control electrode 1032 with the corresponding switch transistor in the first pixel circuit 110.

In some embodiments, the display panel 10 includes a substrate 101 and a first metal layer 102, a second metal layer 103 and a third metal layer 104 on the substrate 101. The second metal layer 103 is located between the first metal layer 102 and the third metal layer 104, and the second metal layer 103 is insulated from the first metal layer 102. The second metal layer 103 is insulated from the third metal layer 104. The first electrodes and the second electrodes of the switch transistors and the drive transistor M0 in the second pixel circuit 120 are all located at the first metal layer 102. The control electrodes of the switch transistors and the drive transistor M0 in the second pixel circuit 120 are all located at the second metal layer 103. The first electrodes and the second electrodes of the switch transistors and the drive transistor M0 in the first pixel circuit 110 are all located at the third metal layer 104.

In some embodiments, the orthographic projection of the first electrode 1022 of a switch transistor in the second pixel circuit 120 on the substrate 101 overlaps the orthographic projection of the first electrode 1042 of the corresponding switch transistor in the first pixel circuit 110 on the substrate 101. The orthographic projection of the second electrode 1024 of a switch transistor in the second pixel circuit 120 on the substrate 101 overlaps the orthographic projection of the second electrode 1044 of the corresponding switch transistor in the first pixel circuit 110 on the substrate 101.

In some embodiments, the plurality of switch transistors in the first pixel circuit 110 includes a first transistor M1$a$, a second transistor M2$a$, a third transistor M3$a$, a fourth transistor M4$a$, a fifth transistor M5$a$ and a sixth transistor M6$a$.

The first electrode of the first transistor M1$a$ is configured to input the first voltage signal PVDD. The first electrode of the second transistor M2$a$ is configured to input the data signal Vdata. The second electrode of the first transistor M1$a$, the second electrode of the second transistor M2$a$ and the first electrode of the drive transistor M0$a$ are connected in common to the first node a1. The second electrode of the drive transistor M0$a$, the first electrode of the third transistor M3$a$, and the first electrode of the fourth transistor M4$a$ are connected in common to the second node b1. The first electrode plate of the capacitor C1 is connected to the first electrode of the first transistor M1$a$. The second electrode plate of the capacitor C1, the second electrode of the third transistor M3$a$, the control electrode of the drive transistor M0$a$ and the second electrode of the fifth transistor M5$a$ are connected in common to the third node c1. The first electrode of the fifth transistor M5a is configured to input the second voltage signal Vref. The second electrode of the fourth transistor M4a, the second electrode of the sixth transistor M6a and the anode of the first sub-pixel OLED1 are connected in common to the fourth node d1. The first electrode of the sixth transistor M6a is configured to input the second voltage signal Vref. The cathode of the first sub-pixel OLED1 is used to input the third voltage signal PVEE.

When the first sub-pixel OLED1 is driven by the first pixel circuit 110 to emit light, the fifth transistor M5a and the sixth transistor M6a are switched on in the first period T1. The second transistor M2a and the third transistor M3a are switched on in the second period T2. The first transistor M1a and the fourth transistor M4a are switched on in the third period T3.

In some embodiments, when the display device 20 is in operation, the data signal Vdata is output by the source driver 210, and the first scan signal SCAN1, the second scan signal SCAN2 and the emission signal EMIT are output by the gate driver 220. The first voltage signal PVDD, the second voltage signal Vref and the third voltage signal PVEE are provided by a circuit board in the display device 20. In this case, if the plurality of switch transistors in the first pixel circuit 110 are all P-type transistors, and the plurality of switch transistors in the second pixel circuit 120 are all N-type transistors, then electrical signals input to the corresponding two switch transistors in the first pixel circuit 110 and the second pixel circuit 120 may be the same. That is to say, the connection mode between the second pixel circuit 120 and the gate driver 220 is the same as the that between the first pixel circuit 120 and the gate driver 220, and the connection mode between the second pixel circuit 120 and the source driver 210 is also the same as that between the first pixel circuit 120 and the source driver 210. For example, the first electrode of the second transistor M2a in the first pixel circuit 110 is connected to an output of the source driver 210; and the first electrode of the second transistor M2b in the second pixel circuit 120 is also connected to the same output of the source driver 210. The control electrodes of the fifth transistor M5a and the sixth transistor M6a in the first pixel circuit 110 are connected to an output of the gate driver 220 to input the first scan signal SCAN1; The control electrodes of the fifth transistor M5b and the sixth transistor M6b in the second pixel circuit 120 are also connected to the same output of the gate driver 220, to input the first scan signal SCAN1. The control electrodes of the second transistor M2a and the third transistor M3a in the first pixel circuit 110 are connected to an output of the gate driver 220 to input the second scan signal SCAN2; and the control electrodes of the second transistor M2b and the third transistor M3b in the second pixel circuit 120 are also connected to the same output of the gate driver 220 to input the second scan signal SCAN2. The control electrodes of the first transistor M1a and the fourth transistor M4a in the first pixel circuit 110 are connected to an output of the gate driver 220 to input the emission signal EMIT; and the control electrodes the first transistor M1b and the fourth transistor M4a in the second pixel circuit 120 are also connected to the same output of the gate driver 220 to input the emission signal EMIT.

The display device 20 includes the display panel 10 in any one of the above-mentioned embodiments, when multiple frames of images are continuously displayed, the first sub-pixel OLED1 and the second sub-pixel OLED2 can emit light alternately. In this way, the service life of the display panel 10 can be prolonged, and the performance and competitiveness of the product can be improved.

The above-mentioned embodiments are only used to illustrate the schemes of the present application, and are not intended to limit the present application. Although the present application has been described in detail with reference to the above-mentioned embodiments, those of ordinary skill in the art should understand that the schemes in the above-mentioned embodiments may be modified, or some features of those embodiments may be equivalently replaced. These modifications or replacements do not make the essence of the corresponding schemes deviate from the fundamental and principles of the schemes in the embodiments of the present application, and should all be included within the protection scope of the present application.

What is claimed is:

1. A display panel, comprising: a first sub-pixel and a first pixel circuit connected to the first sub-pixel to drive the first sub-pixel to emit light;
   a second sub-pixel and a second pixel circuit, a luminous color of the second sub-pixel is the same as that of the first sub-pixel, and the second pixel circuit is connected to the second sub-pixel to drive the second sub-pixel to emit light; and
   when the display panel is configured to display a same frame of image, the first sub-pixel is driven by the first pixel circuit to emit light, or the second sub-pixel is driven by the second pixel circuit to emit light,
   wherein both the first pixel circuit and the second pixel circuit comprise a drive transistor, a capacitor, and a plurality of switch transistors, and circuit structures of the first pixel circuit and the second pixel circuit are exactly the same; wherein the plurality of switch transistors in the first pixel circuit are all P-type transistors, and the plurality of switch transistors in the second pixel circuit are all N-type transistors;
   wherein a switch transistor in the second pixel circuit shares a control electrode with a corresponding switch transistor in the first pixel circuit, and wherein the display panel comprises a substrate, and a first metal layer, a second metal layer, and a third metal layer on the substrate, the second metal layer is arranged between the first metal layer and the third metal layer, the second metal layer is insulated from the first metal layer, and the second metal layer is insulated from the third metal layer; and
   wherein first electrodes and second electrodes of the plurality of switch transistors and the drive transistor in the second pixel circuit are all located at the first metal layer; control electrodes of the plurality of switch transistors and the drive transistor in the first pixel circuit and the second pixel circuit are all located at the second metal layer; and first electrodes and second electrodes of the plurality of switch transistors and the drive transistor in the first pixel circuit are all located at the third metal layer.

2. The display panel according to claim 1, wherein when the display panel is configured to display a N-th frame of image, the first sub-pixel is driven by the first pixel circuit to emit light, and the second pixel circuit is not in operation, so that the second sub-pixel does not emit light; when the display panel is configured to display a (N+1)-th frame image, the second sub-pixel is driven by the second pixel circuit to emit light, and the first pixel circuit is not in operation, so that the first sub-pixel does not emit light; and N is an odd number.

3. The display panel according to claim 2, wherein the switch transistors in the second pixel circuit have a same number as that of the switch transistors in the first pixel circuit, and the plurality of switch transistors in the second pixel circuit correspond one-to-one to the plurality of switch transistors in the first pixel circuit; a connection mode between the drive transistor, the capacitor and the plurality of switch transistors in the second pixel circuit is the same as that between the drive transistor, the capacitor and the plurality of switch transistors in the first pixel circuit.

4. The display panel according to claim 1, wherein the second sub-pixel and the first sub-pixel are arranged along a thickness direction of the display panel.

5. The display panel according to claim 4, wherein the switch transistors in the second pixel circuit have a same number as that of the switch transistors in the first pixel circuit, and the plurality of switch transistors in the second pixel circuit correspond one-to-one to the plurality of switch transistors in the first pixel circuit; and a connection mode between the drive transistor, the capacitor, and the plurality of switch transistors in the second pixel circuit is the same as that between the drive transistor, the capacitor, and the plurality of switch transistors in the first pixel circuit.

6. The display panel according to claim 1, wherein the switch transistors in the second pixel circuit have a same number as that of the switch transistors in the first pixel circuit, and the plurality of switch transistors in the second pixel circuit correspond one-to-one to the plurality of switch transistors in the first pixel circuit; a connection mode between the drive transistor, the capacitor and the plurality of switch transistors in the second pixel circuit is the same as that between the drive transistor, the capacitor and the plurality of switch transistors in the first pixel circuit.

7. The display panel according to claim 6, wherein the plurality of switch transistors in the first pixel circuit comprises a first transistor, a second transistor, a third transistor, a fourth transistor, a fifth transistor, and a sixth transistor;
a first electrode of the first transistor is configured to input a first voltage signal, a first electrode of the second transistor is configured to input a data signal, a second electrode of the first transistor, a second electrode of the second transistor, and a first electrode of the drive transistor in the first pixel circuit are connected in common to a first node;
a second electrode of the drive transistor in the first pixel circuit, a first electrode of the third transistor, and a first electrode of the fourth transistor are connected in common to a second node;
a first electrode plate of the capacitor in the first pixel circuit is connected to the first electrode of the first transistor, a second electrode plate of the capacitor in the first pixel circuit, a second electrode of the third transistor, a control electrode of the drive transistor in the first pixel circuit, and a second electrode of the fifth transistor are connected in common to a third node; and a first electrode of the fifth transistor is configured to input a second voltage signal;
a second electrode of the fourth transistor, a second electrode of the sixth transistor, and an anode of the first sub-pixel are connected in common to a fourth node; and a first electrode of the sixth transistor is configured to input the second voltage signal, a cathode of the first sub-pixel is configured to input a third voltage signal; and
when the first sub-pixel is driven by the first pixel circuit to emit light, the fifth transistor and the sixth transistor are switched on in a first period; the second transistor and the third transistor are switched on in a second period; and the first transistor and the fourth transistor are switched on in a third period.

8. The display panel according to claim 1, wherein an orthographic projection of the first electrode of any switch transistor in the second pixel circuit on the substrate overlaps that of the first electrode of a corresponding switch transistor in first pixel circuit on the substrate; and
an orthographic projection of the second electrode of any switch transistor in the second pixel circuit on the substrate overlaps that of the second electrode of a corresponding switch transistor in the first pixel circuit on the substrate.

9. A display device, comprising:
a gate driver;
a source driver; and
a display panel, comprising:
a first sub-pixel and a first pixel circuit connected to the first sub-pixel to drive the first sub-pixel to emit light;
a second sub-pixel and a second pixel circuit connected to the second sub-pixel to drive the second sub-pixel to emit light, wherein a luminous color of the second sub-pixel is the same as that of the first sub-pixel; and
when the display panel is configured to display a same frame of image, the first sub-pixel is driven by the first pixel circuit to emit light, or the second sub-pixel is driven by the second pixel circuit to emit light,
wherein both the first pixel circuit and the second pixel circuit comprise a drive transistor, a capacitor, and a plurality of switch transistors, and circuit structures of the first pixel circuit and the second pixel circuit are exactly the same; wherein the plurality of switch transistors in the first pixel circuit are all P-type transistors, and the plurality of switch transistors in the second pixel circuit are all N-type transistors;
wherein a switch transistor in the second pixel circuit shares a control electrode with a corresponding switch transistor in the first pixel circuit, and wherein the display panel comprises a substrate, and a first metal layer, a second metal layer, and a third metal layer on the substrate, the second metal layer is arranged between the first metal layer and the third metal layer, the second metal layer is insulated from the first metal layer, and the second metal layer is insulated from the third metal layer;
wherein first electrodes and second electrodes of the plurality of switch transistors and the drive transistor in the second pixel circuit are all located at the first metal layer; control electrodes of the plurality of switch transistors and the drive transistor in the first pixel circuit and the second pixel circuit are all located at the second metal layer; and first electrodes and second electrodes of the plurality of switch transistors and the drive transistor in the first pixel circuit are all located at the third metal layer; and
wherein the first pixel circuit is connected to the gate driver and the source driver, to drive the first sub-pixel to emit light; and the second pixel circuit is connected to the gate driver and the source driver to drive the second sub-pixel to emit light.

10. The display device according to claim 9, wherein the first pixel circuit comprises a drive transistor, a capacitor, and a plurality of switch transistors, and the plurality of switch transistors in the first pixel circuit are all P-type transistors;

the second pixel circuit comprises a drive transistor, a capacitor, and a plurality of switch transistors, and the plurality of switch transistors in the second pixel circuit are all N-type transistors; and a connection mode between the second pixel circuit and the gate driver is the same as that between the first pixel circuit and the gate driver, and a connection mode between the second pixel circuit and the source driver is the same as that between the first pixel circuit and the source driver.

11. The display device according to claim 9, wherein when the display panel is configured to display a N-th frame of image, the first sub-pixel is driven by the first pixel circuit to emit light, and the second pixel circuit is not in operation, so that the second sub-pixel does not emit light; when the display panel is configured to display a (N+1)-th frame image, the second sub-pixel is driven by the second pixel circuit to emit light, and the first pixel circuit is not in operation, so that the first sub-pixel does not emit light; and N is an odd number.

12. The display device according to claim 11, wherein the switch transistors in the second pixel circuit have a same number as that of the switch transistors in the first pixel circuit, and the plurality of switch transistors in the second pixel circuit correspond one-to-one to the plurality of switch transistors in the first pixel circuit; a connection mode between the drive transistor, the capacitor and the plurality of switch transistors in the second pixel circuit is the same as that between the drive transistor, the capacitor, and the plurality of switch transistors in the first pixel circuit.

13. The display device according to claim 9, wherein the second sub-pixel and the first sub-pixel are arranged along a thickness direction of the display panel.

14. The display device according to claim 13, wherein the switch transistors in the second pixel circuit have a same number as that of the switch transistors in the first pixel circuit, and the plurality of switch transistors in the second pixel circuit correspond one-to-one to the plurality of switch transistors in the first pixel circuit; a connection mode between the drive transistor, the capacitor and the plurality of switch transistors in the second pixel circuit is the same as that between the drive transistor, the capacitor and the plurality of switch transistors in the first pixel circuit.

15. The display device according to claim 9, wherein the switch transistors in the second pixel circuit have a same number as that of the switch transistors in the first pixel circuit, and the plurality of switch transistors in the second pixel circuit correspond one-to-one to the plurality of switch transistors in the first pixel circuit; a connection mode between the drive transistor, the capacitor and the plurality of switch transistors in the second pixel circuit is the same as that between the drive transistor, the capacitor and the plurality of switch transistors in the first pixel circuit.

16. The display device according to claim 15, wherein the plurality of switch transistors in the first pixel circuit comprises a first transistor, a second transistor, a third transistor, a fourth transistor, a fifth transistor, and a sixth transistor;

a first electrode of the first transistor is configured to input a first voltage signal, a first electrode of the second transistor is configured to input a data signal, a second electrode of the first transistor, a second electrode of the second transistor, and a first electrode of the drive transistor in the first pixel circuit are connected in common to a first node;

a second electrode of the drive transistor in the first pixel circuit, a first electrode of the third transistor, and a first electrode of the fourth transistor are connected in common to a second node;

a first electrode plate of the capacitor in the first pixel circuit is connected to the first electrode of the first transistor, a second electrode plate of the capacitor in the first pixel circuit, a second electrode of the third transistor, a control electrode of the drive transistor in the first pixel circuit, and a second electrode of the fifth transistor are connected in common to a third node; and a first electrode of the fifth transistor is configured to input a second voltage signal;

a second electrode of the fourth transistor, a second electrode of the sixth transistor, and an anode of the first sub-pixel are connected in common to a fourth node; and a first electrode of the sixth transistor is configured to input the second voltage signal, and a cathode of the first sub-pixel is configured to input a third voltage signal; and when the first sub-pixel is driven by the first pixel circuit to emit light, the fifth transistor and the sixth transistor are switched on in a first period; the second transistor and the third transistor are switched on in a second period; and the first transistor and the fourth transistor are switched on in a third period.

17. The display device according to claim 9, wherein an orthographic projection of the first electrode of any switch transistor in the second pixel circuit on the substrate overlaps that of the first electrode of a corresponding switch transistor in first pixel circuit on the substrate; and an orthographic projection of the second electrode of any switch transistor in the second pixel circuit on the substrate overlaps that of the second electrode of a corresponding switch transistor in the first pixel circuit on the substrate.

* * * * *